(12) United States Patent
Hu

(10) Patent No.: US 9,129,834 B2
(45) Date of Patent: Sep. 8, 2015

(54) SUBMOUNT FOR LED DEVICE PACKAGE

(71) Applicant: KABUSHIKI KAISHA TOSHIBA, Tokyo (JP)

(72) Inventor: Syn-Yem Hu, San Jose, CA (US)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/114,332

(22) PCT Filed: Jun. 28, 2013

(86) PCT No.: PCT/US2013/048602
§ 371 (c)(1),
(2) Date: Oct. 28, 2013

(87) PCT Pub. No.: WO2014/011419
PCT Pub. Date: Jan. 16, 2014

(65) Prior Publication Data
US 2015/0171059 A1 Jun. 18, 2015

Related U.S. Application Data

(60) Provisional application No. 61/669,995, filed on Jul. 10, 2012.

(51) Int. Cl.
*H01L 33/00* (2010.01)
*H01L 25/075* (2006.01)
(Continued)

(52) U.S. Cl.
CPC .......... *H01L 25/0753* (2013.01); *H01L 33/486* (2013.01); *H01L 33/507* (2013.01); *H01L 33/60* (2013.01); *F21K 9/00* (2013.01); *F21V 7/06* (2013.01); *F21Y 2101/02* (2013.01); *H01L 33/50* (2013.01); *H01L 2924/0002* (2013.01);
(Continued)

(58) Field of Classification Search
CPC ................................. H01L 33/42; H01L 33/46
USPC ...................................................... 257/88, 98
See application file for complete search history.

(56) References Cited

U.S. PATENT DOCUMENTS

| | | | |
|---|---|---|---|
| 6,903,381 B2 * | 6/2005 | Lin et al. .......................... | 257/99 |
| 7,193,358 B2 | 3/2007 | Yamada et al. | |
| 8,698,174 B2 * | 4/2014 | Hsieh ............................... | 257/98 |
| 2007/0176186 A1 * | 8/2007 | Lin ................................... | 257/79 |
| 2007/0263384 A1 * | 11/2007 | Hsieh et al. .................... | 362/231 |

(Continued)

OTHER PUBLICATIONS

International Preliminary Report dated Jan. 22, 2015 corresponding to International Application No. PCT/US2013/048602.

*Primary Examiner* — David Vu
*Assistant Examiner* — Brandon Fox
(74) *Attorney, Agent, or Firm* — Hogan Lovells US LLP

(57) ABSTRACT

A light emitting diode (LED) assembly may include an LED semiconductor attached to a first surface of a submount made of optically transparent material. The submount may redirect back side light emitted by the LED semiconductor light away from the LED semiconductor to increase recovery of back side light. The submount may be used with an external bulk reflecting element. The submount may itself include a reflective coating at a second surface opposite from the first surface and be mounted on a reflecting substrate. The submount may include a phosphor forming the first surface or the second surface. The first surface or the second surface may be a textured surface. An array of LED semiconductors may be mounted to the submount. The array of LED semiconductors may be disposed on the submount in an arrangement that optimizes total light output of the LED assembly.

24 Claims, 8 Drawing Sheets

(51) Int. Cl.
  *H01L 33/60* (2010.01)
  *H01L 33/48* (2010.01)
  *H01L 33/50* (2010.01)
  *F21K 99/00* (2010.01)
  *F21V 7/06* (2006.01)
  *F21Y 101/02* (2006.01)

(52) U.S. Cl.
  CPC . *H01L2933/0033* (2013.01); *H01L 2933/0058* (2013.01); *H01L 2933/0091* (2013.01)

(56) References Cited

U.S. PATENT DOCUMENTS

| | | | |
|---|---|---|---|
| 2009/0039367 A1* | 2/2009 | Iso et al. | 257/98 |
| 2009/0315061 A1 | 12/2009 | Andrews | |
| 2010/0201254 A1* | 8/2010 | Matsumura | 313/501 |
| 2010/0289043 A1* | 11/2010 | Aurelien et al. | 257/98 |
| 2012/0043568 A1* | 2/2012 | Yan et al. | 257/98 |
| 2012/0126260 A1 | 5/2012 | Hussell et al. | |
| 2012/0248469 A1* | 10/2012 | Choi | 257/88 |

* cited by examiner

SUBMOUNT FOR LED DEVICE PACKAGE

This application is a U.S. National Phase filing under 35 U.S.C. § 371 of PCT/US2013/048602, which was filed on Jun. 28, 2013, which is herein incorporated in its entirety, which claims priority to Provisional Application Serial No. 61/669,955, which was filed on Jul. 10, 2012, which is herein incorporated in its entirety.

BACKGROUND

1. Field of the Disclosure

The present disclosure relates to light emitting diodes (LEDs), and more particularly to packages for LED devices.

2. Description of the Related Art

Light emitting diodes (LEDs) are commonly used as optical display indicators in a variety of other industrial and consumer lighting applications. Recently, high-power LEDs have seen increased use in various applications. Typically, high-power LEDs are provided as part of a package or other assembly that includes an LED semiconductor mounted to a substrate. Light emitted from a back side of the LED semiconductor may be lost unless redirected by a device package to reflect back and contribute to the output optical power. Light may also be lost, in part, due to internal reflections occurring at interfaces in the package and absorption by the LED semiconductor.

SUMMARY

Figure 1:
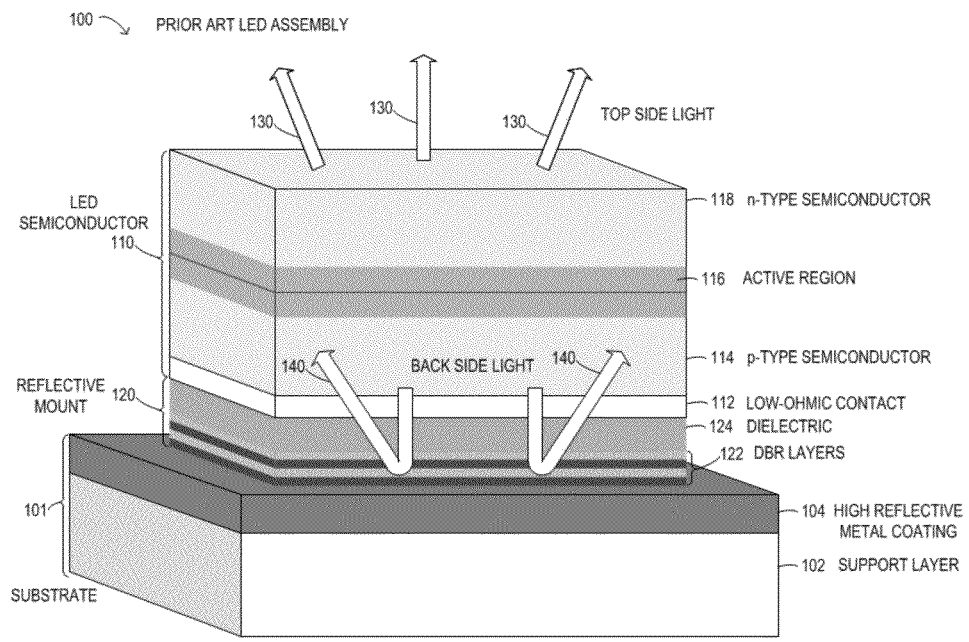
FIG. 1 depicts selected elements of an embodiment of a prior art LED assembly.

In one aspect, a disclosed method of assembling an LED assembly includes attaching an LED semiconductor to a first surface of a submount. The LED semiconductor may include a p-type semiconductor and an n-type semiconductor forming a p-n junction defining an active region where light is generated. The submount may include an optically transparent material. Attaching the LED semiconductor to the first surface may include providing the light generated at the active region with an optical path to the submount at the first surface.

In another aspect, a disclosed LED assembly includes an LED semiconductor, contact layer, and a submount. The LED semiconductor may include a p-type semiconductor and an n-type semiconductor forming a p-n junction defining an active region where light is generated, and a contact layer in contact with one of the p-type semiconductor and the n-type semiconductor. The contact layer may be in contact with one of the p-type semiconductor and the n-type semiconductor and may include a transparent, low-ohmic material. The submount may be attached to the LED semiconductor at a first surface and may include an optically transparent material. A thickness of the submount may be selected to comply with a thermal resistance parameter. The light generated at the active region follows an optical path to the submount at the first surface.

In yet another aspect, a disclosed LED lighting module includes an LED assembly and a bulk reflector. The LED assembly may include an array of LED semiconductors, including a first LED semiconductor. The first LED semiconductor may include a p-type semiconductor and an n-type semiconductor forming a p-n junction defining an active region where light is generated. The LED assembly may also include a submount supporting the array of LED semiconductors at a first surface. The submount may include an optically transparent material. The array of LED semiconductors may be disposed on the first surface to maximize total light output of the LED assembly by maintaining a specified exposed surface area of the first surface adjacent to interior edges of each LED semiconductor in the array of LED semiconductors with respect to the submount. The light generated at the active region follows an optical path to the submount at the first surface.

In the following description, details are set forth by way of example to facilitate discussion of the disclosed subject matter. It should be apparent to a person of ordinary skill in the field, however, that the disclosed embodiments are exemplary and not exhaustive of all possible embodiments.

DESCRIPTION OF THE EMBODIMENT(S)

An LED includes a semiconductor material extrinsically doped with impurities that add electrically mobile electrons and/or holes to the semiconductor, which can move in the material relatively freely. Depending on the kind of impurity, an extrinsically doped region of the semiconductor can be either n-type or p-type semiconductor regions. In an LED semiconductor (also referred to as an "LED device", a "die", a "chip", or a "device"), the semiconductor includes an n-type region in contact with or in close proximity to, and a p-type region. A reverse electric field at a junction between the two regions causes the electrons and holes to move away from the junction to form a depletion region referred to herein as an "active region." When a forward voltage sufficient to overcome the reverse electric field is applied across the p-n junction, electrons and holes are forced into the active region and combine. When an electron combines with a hole, energy in the form of a photon is emitted. If the band gap of the semiconductor is within a specified range the energy emitted is within the visible portion of the spectrum (i.e., light).

The efficiency with which an LED converts electricity to light, known as "external quantum efficiency," may be determined by a product of internal quantum efficiency, light-extraction efficiency, and losses due to electrical resistance. An "internal quantum efficiency" may be determined by the quality of the semiconductor layers and the energy band structure of the semiconductor materials used to build the LED device. A "light extraction efficiency" is defined as the ratio of the light that leaves the LED device to the light that is generated within the active region. The light extraction efficiency may be determined by a geometry of the LED device, self-absorption of light in semiconductor layers, light absorption by electrical contacts, and/or light absorption by materials in contact with the LED device that are used to mount the device in a package. Semiconductor layers have relatively high indexes of refraction and consequently, light that is generated in the active region may be internally-reflected by surfaces of a die many times before escaping.

When an LED device is energized, light emits from the active layer in all directions, impinging on the LED device surfaces at many different angles. Typical semiconductor materials have a high index of refraction compared to ambient air (n=1.0) or encapsulating epoxy (n≈1.5). According to Snell's law, light traveling from a material having an index of refraction, $n_1$, to a material with a lower index of refraction, $n_2$, at an angle less than a certain critical angle $\theta_c$ relative to a surface normal direction will cross to the lower index region, where:

$$\theta_c = \sin^{-1}(n_1/n_2) \quad \text{Equation (1)}$$

Light that reaches a semiconductor surface at angles greater than $\theta_c$ will experience total internal reflection. This light is reflected back into the LED device where it may be absorbed within semiconductor and/or metal layers of the device. In conventional LEDs, the vast majority of light generated within the structure may suffer total internal reflection at least once before escaping from a semiconductor device.

In the drawings, certain elements of LED devices and LED assembly are depicted as layers of material, indicating how a solid-state LED assembly may be constructed. Certain elements in an actual LED assembly may have been omitted from the figures, such as contact layers, lead wires, heat sinks, etc., for descriptive clarity and ease of understanding. Certain layers depicted in the figures may be shown in cross-section as a simplified rectangular form for descriptive purposes, while an actual layout and/or form of layers in a physical device may vary in shape, size, thickness, etc. Depicted elements in the following figures are not necessarily drawn to scale but are generally representative of an operable device arrangement. It is also noted that while certain orientations and device polarities are shown in the figures, the inventive aspects of the present disclosure may be practiced with various types of LED devices and LED assemblies, including embodiments not shown in the figures. In particular, the LED devices and LED assemblies disclosed herein may be implemented using various mounting orientations and mounting techniques such as, flip-chip, die attach, surface mount, wire bonding, and combinations thereof.

Referring now to FIG. 1, selected elements of an embodiment of prior art LED assembly 100 are depicted. As shown, LED assembly 100 includes LED semiconductor 110 to which reflective mount 120 has been mounted and substrate 101, including high reflective metal coating 104 and support layer 102, which may represent a support structure of LED assembly 100. In particular embodiments, substrate 101 may be thermally and/or electrically conductive, and may serve to dissipate heat generated by LED semiconductor 110.

LED semiconductor 110 includes p-type semiconductor 114 adjacent to n-type semiconductor 118, while active region 116 is formed therebetween. In various embodiments, p-type semiconductor 114 and/or n-type semiconductor 118 may be GaN-based epitaxial layers. Active region 116 may represent an area from where photons are initially generated during operation of LED assembly 100. Since active region 116 is embedded centrally within LED semiconductor 110, emitted light must escape LED semiconductor 110 to be useful and contribute to total light output. Accordingly, top side light 130 may represent light generated in active region 116 that escapes LED semiconductor 110 at a top (i.e., exposed) surface. It is noted that light may physically escape from LED semiconductor 110 at other exposed surfaces, such as side surfaces (not shown). However, for the purposes of the present disclosure, top side light 130 may represent light emerging at exposed surfaces of LED semiconductor 110. As depicted in FIG. 1, LED semiconductor 110 is shown including transparent low-ohmic contact layer 112, which may not be a semiconductor, to a back (or bottom) surface of LED semiconductor 110 to allow for electrical contact. Various other contact elements have been omitted from FIG. 1 for descriptive clarity. It is noted that a placement and arrangement of transparent low-ohmic contact layer 112 may vary in different embodiments.

In FIG. 1, reflective mount 120 is provided as a reflective element on a back (or bottom) surface of LED semiconductor 110 and is shown adjacent to low-ohmic contact 112, which may represent a layer of transparent conductive material, such as indium tin oxide (ITO), for example. Reflective mount 120 is shown including a Distributed Bragg Reflector, DBR layers 122, that are alongside dielectric 124. Thus, reflective mount 120 may reflect back side light 140 to enable light to escape and contribute to total light output by LED assembly 100. Without reflective mount 120, much or all of back side light 140 may remain unrecovered and/or be lost, which may reduce an overall efficiency of LED assembly 100. However, various pathways of back side light 140 interacting with reflective mount 120 may lead back through LED semiconductor 110, which may still reduce an amount of light that escapes LED assembly 100, and contributes to total light output. For example, LED semiconductor 110 may be highly absorptive for light generated in active region 116. Furthermore, certain pathways of back side light 140 may lead to internal reflection and/or total internal reflection within LED semiconductor 110. As a result of a reflective pathway taken by back side light 140 back through LED semiconductor 110, a portion of back side light 140 may remain unrecovered and may not contribute to total light output. Thus, redirection of back side light 140 through LED semiconductor 110 by reflective mount 120 may still be associated with certain losses of back side light 140 that remains unrecovered and does not contribute to the efficiency of total light output. In addition, reflective mount 120 may also be associated with other disadvantages, such as high cost, long production times, large use of production resources, low reliability, poor precision, and large variances in performance characteristics, among various relative and/or absolute factors.

Figure 2:
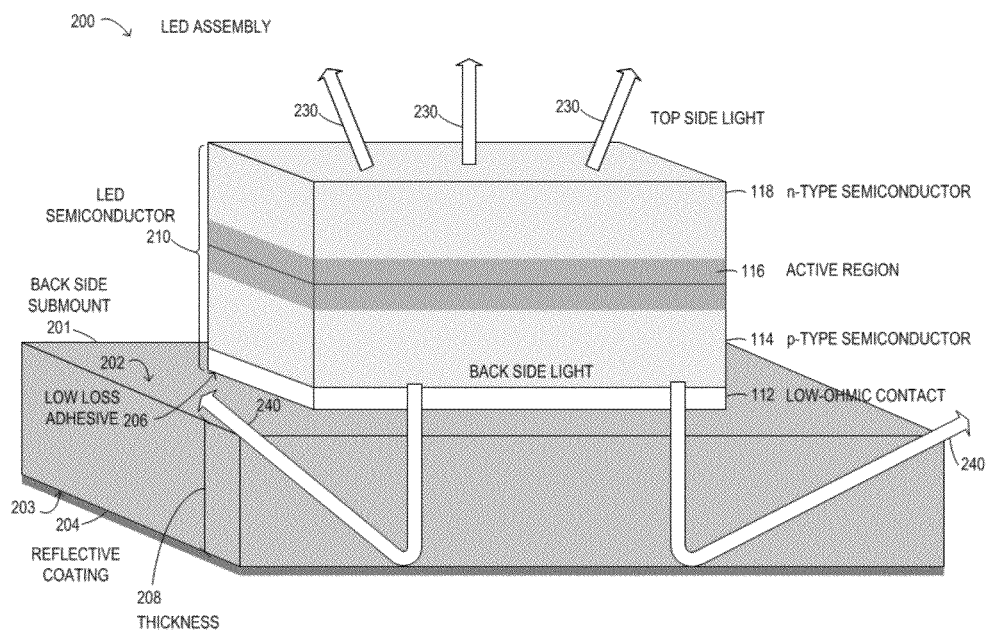
FIG. 2 depicts selected elements of an embodiment of an LED assembly.

Turning now to FIG. 2, a block diagram of selected elements of an embodiment of LED assembly 200 is illustrated. As shown in FIG. 2, LED assembly 200 includes LED semiconductor 210, back side submount 201, and reflective coating 204. LED semiconductor 210 includes n-type semiconductor 118, active region 116, p-type semiconductor 114, and low-ohmic contact 112. As shown, LED semiconductor 210 may be substantially similar to LED semiconductor 110 (see FIG. 1). In order to attain certain improvements in cost and performance, LED assembly 200 does not include a reflective mount, but rather, incorporates unique back side submount 201 (also referred to herein as simply "submount") to which LED semiconductor 210 is mounted, as will now be described in further detail.

In some embodiments, back side submount 201 is implemented as a layer of optically transparent material, which desirably has a high index of refraction. Examples of materials from which back side submount 201 may be produced include sapphire, diamond, silica, glass and/or various compositions thereof. As shown, back side submount 201 may be attached to LED semiconductor 210 at first surface 202 of back side submount 201 using low loss adhesive 206. Low loss adhesive 206 may be a material that exhibits good transmission (i.e., low absorptive losses) of back side light 240 and enables mechanical bonding of LED semiconductor 210 to first surface 202 of back side submount 201. In one embodiment, low loss adhesive 206 is a silicone adhesive. In certain embodiments, low loss adhesive 206 may be selected, in part, based on thermal properties, such as thermal conductivity.

As shown in FIG. 2, back side submount 201 has a thickness 208. Thickness 208 may be selected based on various factors, depending on material and a particular arrangement of LED assembly 200. For example, increasing thickness 208 may result in an improved optical efficiency of guiding back side light 240 away from LED semiconductor 210. When back side submount 201 is made from a material with moderate thermal conductivity, as is the case with certain optically transparent materials having a high index of refraction, a thickness 208 exceeding a specified threshold may result in insufficient conduction of heat away from LED semiconductor 210 and may cause an operating temperature of LED assembly 200 to exceed a recommended or specified limit. In certain instances, a maximum thickness of the submount is selected to comply with a thermal resistance parameter, for example, such as an engineering specification for a particular design. In given embodiments, when LED semiconductor 210 is about 150 μm thick, thickness 208 may be about 200 μm or greater, and may be in the range of about 200-600 μm.

Depending on a type of LED assembly 200, back side submount 201 may include reflective coating 204 on second surface 203. Reflective coating 204 may be a highly reflective metal coating, including gold or silver or another metallic alloy. It is noted that in certain embodiments, reflective coating 204 may be omitted. The surfaces of back side submount 201, including first surface 202 and second surface 203 as well as side surfaces, may be smooth flat surfaces and/or polished surfaces to reduce losses of back side light 240. For example, first surface 202 and/or other surfaces of back side submount 201 may be controllably formed with a root-mean-square roughness of less than approximately 3 nm. In certain embodiments, second surface 203 may be a textured surface (not shown in FIG. 2), such as a regularly and/or irregularly bumped surface, in order to provide additional pathways for back side light 240 to be reflected away from LED semiconductor 210 (see also FIG. 3).

In operation of LED assembly 200, when LED semiconductor 210 is forward biased, active region 116 becomes a light source. In one example, when LED semiconductors 210 are formed using GaN-based semiconductors, blue light having a wavelength of about 450 nm may be emitted at active region 116, corresponding to a band gap of the semiconductor material. Top side light 230 may escape LED semiconductor 210 at exposed surfaces and contribute to total light output. As shown, back side light 240 may pass through low-ohmic contact layer 112, enter back side submount 201, and reflect away from LED semiconductor 210 at reflective coating 204. In this manner, back side light 240 is provided an optical path to back side submount 201 at first surface 202, from where back side light 240 may be recovered and contribute to total light output of LED assembly 200. At first surface 202, an amount of exposed area of back side submount 201 adjacent to LED semiconductor 210 may also contribute to an amount of back side light 240 that is recovered. It is noted that an optimal value for the exposed area of back side submount 201 at first surface 202 adjacent to each edge of LED semiconductor 210 may be about the area and/or width of LED semiconductor 210 (see also FIG. 4A). It is also noted that in LED assemblies having a single LED semiconductor 210, a concentric placement of LED semiconductor 210 with respect to back side submount 301 may be advantageous in terms of optimizing recovered light. Accordingly, embodiments of LED assembly 200 using back side submount 201 have been observed to increase total light output (i.e., reduce light losses), as compared to prior art LED assembly 100 under comparable conditions, by guiding emitted light directly away from LED semiconductor 210 and preventing reabsorption in the semiconductor layers and/or other elements.

Figure 3:
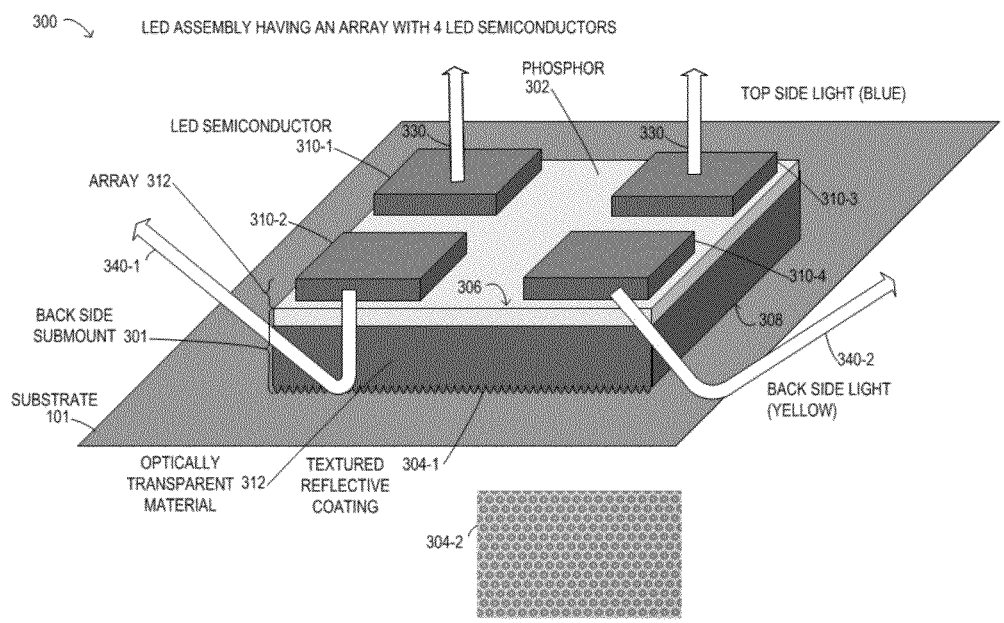
FIG. 3 depicts selected elements of an embodiment of an LED array.

Turning now to FIG. 3, a block diagram of selected elements of an embodiment of LED assembly 300 is illustrated. As shown in FIG. 3, LED assembly 300 includes array 312 with 4 LED semiconductors 310-1, 310-2, 310-3, 310-4 mounted on back side submount 301. LED semiconductors 310 shown in FIG. 3 may represent any of various types of LED semiconductors or semiconductor devices, which may be used to form array 312, including, as examples, LED semiconductor 210 and 810 (see FIGS. 2 and 8). The arrangement of array 312 may be selected to optimize an amount of light that is recovered, as will be described in further detail. LED assembly 300 also uses phosphor 302 as a top layer of back side submount 301 to form first surface 306. Back side submount 301 also includes optically transparent material 310, on which phosphor 302 is placed. Also shown with LED assembly 300 is textured reflective coating 304-1 formed at second surface 308, which is opposite to first surface 306 of back side submount 301. An example image 304-2 of textured reflective coating 304-1 illustrates a regular array of bumps, which may provide a desired roughness characteristic, in combination with a reflective coating. It is noted that in various embodiments, the textured coating (i.e., surface roughness) may be applied independently of the reflective coating to either second surface 308 or first surface 306. Back side submount 301 is depicted as being mounted at second surface 308 to substrate 101 (see FIG. 1), which may be reflective.

In FIG. 3, array 312 of four LED semiconductors 310-1, 310-2, 310-3, 310-4 may be mounted on first surface 306 in an arrangement designed to reduce cross-reflection and cross-absorption among LED semiconductors 310. The arrangement may depend upon the number of LED semiconductors 310 in array 312, which may vary. At the edges of first surface 306, for example, back side light 340-1 emitted at outer edges (with respect to back side submount 301) of LED semiconductor 310-2 may be more likely to escape and avoid reflection back to adjacent LED semiconductors 310-1 and 310-3. Also, back side light 340-2 may follow a light pathway at the edges of back side submount 301 directly towards substrate 101 from where the light may also escape and contribute to total light output of LED assembly 300. Accordingly, LED semiconductors 310 may be placed at or near the edges of first surface 306 within certain constraints, such as to allow for installation and/or attachment of other components (not shown) of LED assembly 300 including, but not limited to, heat sinks, connectors, wires, etc. Between interior edges (with respect to back side submount 301) of LED semiconductors 310, the exposed area of first surface 306 provides an opportunity for back side light 340 to escape instead of being reflected back (not shown) to adjacent LED semiconductor 310, for example, by textured reflective coating 304. In certain embodiments, the arrangement of array 312 of LED semiconductors 310 may be selected to maximize an exposed area of first surface 306 adjacent to interior edges of each individual LED semiconductor 310 in array 312 (see also FIG. 4A).

As shown in FIG. 3, phosphor 302 forms first surface 306 of back side submount 301. That is; phosphor 302 may be applied as a material layer over optically transparent material 310, which together form back side submount 301. In certain embodiments, phosphor 302 may itself serve as an adhesive and/or serve to attach LED semiconductors 310. As noted previously, LED semiconductors 310 may be formed using GaN-based semiconductors, whose band gap may enable emission of blue light at the active region (see also FIG. 2). In FIG. 3, top side light 330 may represent the blue light directly emitted by LED semiconductors 310. As a result of being placed in contact with, in direct proximity, and/or directly adjacent to LED semiconductors 310, phosphor 302 may convert blue back side light (obscured from view) to back side light 340 that is another color. In the example shown in FIG. 3, phosphor 302 represents a blue to yellow phosphor that absorbs blue back side light emitted from LED semiconductor 310 and emits back side light 340 that is yellow. It is noted that blue light and yellow light may be combined to produce a whiter light, which may be desirable for certain lighting applications. Thus, the use of phosphor 302 may enable LED assembly 300 to output light that appears whiter than when phosphor 302 is absent.

As shown in FIG. 3, the inclusion of phosphor 302 with back side submount 301 may provide numerous advantages, including increased total light output and increased conversion efficiency of blue light to white light. One benefit from using phosphor 302 with back side submount 301 may result from a short pathway of the back side blue light (obscured from view) to reach phosphor 302 from LED semiconductor 310 and become converted to yellow light, as compared to other arrangements (not shown) where a more indirect pathway for blue light to reach a phosphor may be provided. In LED assembly 400, since back side light 340 (yellow) is formed early in the light pathway from an original emission by LED semiconductor 310 where the intensity of incidental back side blue light on phosphor 302 is relatively high, the conversion efficiency of phosphor 302 may be greater than with other arrangements (not shown). Also, the early conversion of blue light to yellow light may result in a greater fraction of yellow light being present at LED assembly 300 at any given time compared to other arrangements (not shown), which may also be advantageous. In particular, because an absorptivity of materials used in various components of LED assembly 300, such as LED semiconductors 310, gold wiring, among others, may be lower for yellow light than for blue light, less overall light may be lost and total light output may be increased. As a result, LED assembly 300 may exhibit improved overall total light output than with comparable prior art designs that do not use back side submount 301. It is noted that while phosphor 302 is shown forming first surface 306 in FIG. 3, other arrangements of phosphor 302 may be practiced with back side submount 301. In one exemplary embodiment, phosphor 302 may form second surface 308, for example, when used in conjunction with a bulk reflective element (see FIG. 5).

Figure 4A:
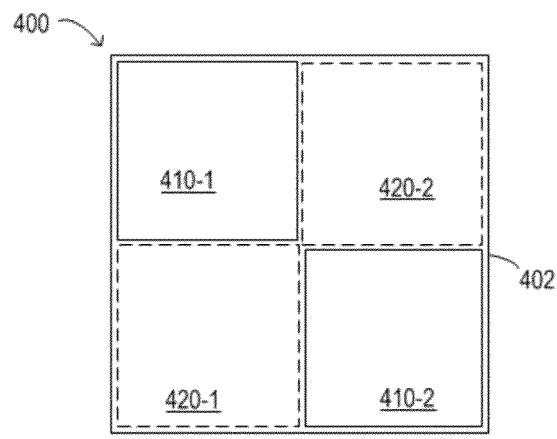
FIGS. 4A and 4B are block diagrams of selected elements of an embodiment of an LED array layout.

Turning now to FIG. 4A, a top view of selected elements of an embodiment of array layout 400 is illustrated. Array layout 400 includes an arrangement of two LED semiconductors 410-1, 410-2 at submount surface 402. In the top view of FIG. 4A, submount surface 402 may represent an embodiment of first surfaces 202, 306 (see FIGS. 2-3). Also shown in FIG. 4A are exposed areas 420-1, 420-2 adjacent to interior edges of LED semiconductors 410-1, 410-2. Elements shown in FIG. 4A are depicted as squares, but it will be understood that the layout methods described herein may be applied to different shapes. In the depicted array layout 400, LED semiconductors 410-1, 410-2 are placed at corner edges of submount surface 402, within the edge constraints mentioned previously.

When a plurality of LED semiconductors (i.e., an array) are used with a back side submount, the amount and arrangement of an exposed area of the submount not covered by the LED semiconductors may influence total light output. The amount of available exposed area on a submount depends on the overall size of the submount and the size and number of the LED semiconductors, among other factors. The amount of back side light emitted from a first LED semiconductor that is not reflected back to a second, adjacent LED semiconductor may be increased when the exposed area between the two is sufficiently large. When back side light is reflected back to an adjacent LED semiconductor in an array, the reflected back side light may be absorbed and may remain unrecovered.

As shown in FIG. 4A, exposed area 420-1 is adjacent to an interior edge of both LED semiconductors 410-1, 410-2. The same is true for exposed area 420-2. Also, exposed areas 420 have a width that is at least as great as a width of LED semiconductor 410. This particular array layout 400 may provide for optimal total light output, because exposed areas 420 of submount surface 402 adjacent to interior edges of each individual LED semiconductor 410 have been maximized within the bounds of submount surface 402. In other words, array layout 400 may represent a unique configuration that minimizes the cross-reflection (and ergo cross-absorption) of back side light emitted by LED semiconductors 410-1, 410-2.

Figure 4B:
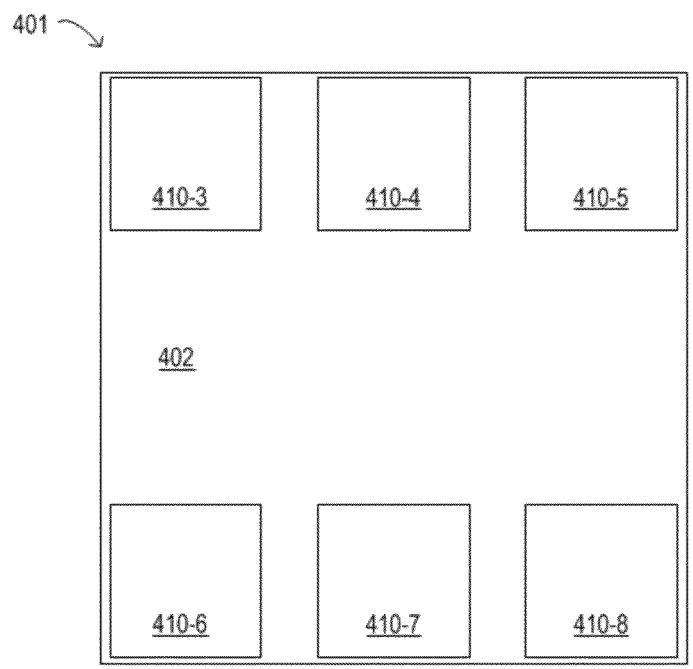

Referring now to FIG. 4B, a top view of selected elements of an embodiment of array layout 401 is illustrated. Array layout 401 depicts an arrangement of six LED semiconductors 410-3, 410-4, 410-5, 410-6, 410-7, 410-8 at submount surface 402. In the top view of FIG. 4B, submount surface 402 may represent an embodiment of first surfaces 202, 306 (see FIGS. 2-3). As shown in array layout 401, LED semiconductors 410-3, 410-4, 410-5, 410-6, 410-7, 410-8 are placed at edges of submount surface 402 to maximize an exposed area (not shown in FIG. 4B, see FIG. 4A) of submount surface 402 adjacent to interior edges of each and/or every individual LED semiconductor 410, within the edge constraints and bounds of submount surface 402, mentioned previously. Array layout 401 may accordingly represent a configuration that optimizes total light output in conjunction with a back side submount, as described herein.

Figure 5:
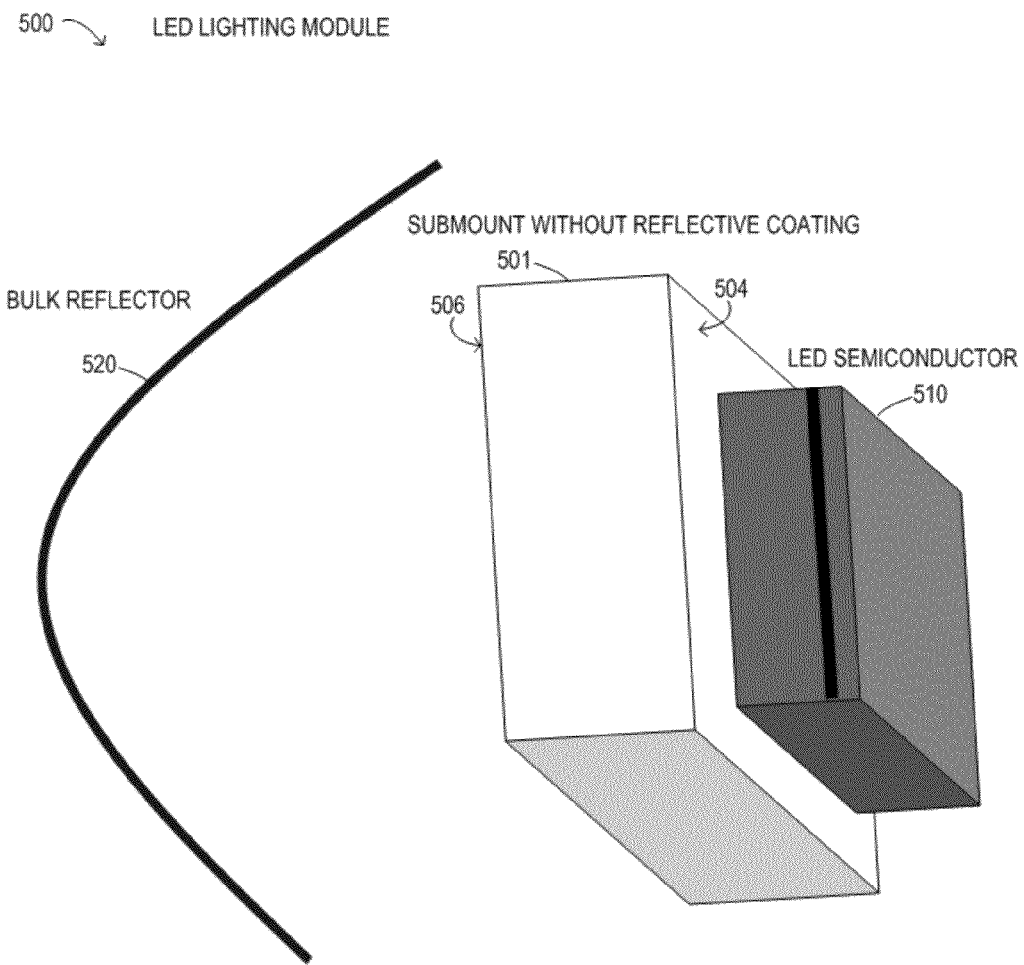
FIG. 5 is a block diagram of selected element's of an embodiment of an LED lighting module.

Advancing now to FIG. 5, a block diagram of selected elements of an embodiment of LED lighting module 500 is illustrated. As shown, LED lighting module 500 includes LED semiconductor 510 attached to submount 501 at first surface 504. LED semiconductor 510 shown in FIG. 5 may represent any of various types of LED semiconductors or semiconductor devices, including, as examples, LED semiconductor 210 and 810 (see FIGS. 2 and 8). In addition, LED lighting module 500 is depicted in a mounting arrangement with a bulk reflector 520 and without a reflective coating at second surface 506 of submount 501. As shown, first surface 504 and second surface 506 are smooth surfaces of an optically transparent material used to form submount 501, and may be highly polished surfaces with a very low roughness characteristic. In other embodiments (not shown), first surface 504 or second surface 506 may be a textured surface (see also FIG. 8). Bulk reflector 520 may represent a parabolic element for generating a desired beam of output light from light provided by LED lighting module 500. Thus, in LED lighting module 500, back side light (not shown) may emerge from second surface 506 and be reflected out by bulk reflector 520. In various embodiments, LED lighting module 500 may incorporate other elements described herein. For example, submount 501 may be used with a phosphor (not shown in FIG. 5) at first surface 504 or at second surface 506 to generate light that differs in color from light generated by LED semiconductor 510 (see also FIGS. 3 and 8).

Figure 6:
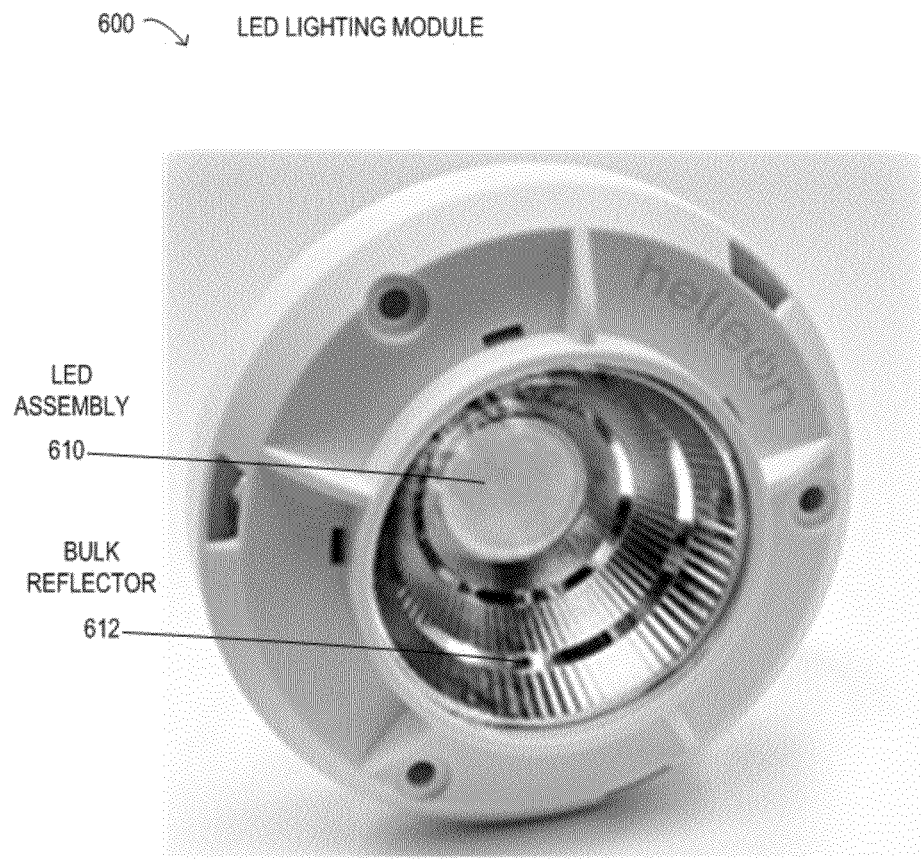
FIG. 6 is an image of an embodiment of an LED lighting module.

Turning now to FIG. 6, an image of selected elements of an embodiment of LED lighting module 600 is provided. LED lighting module 600 may represent any of a variety or types of different LED lighting modules and represents an example implementation of LED assembly 610 and bulk reflector 612. LED assembly 610 may represent an embodiment of LED assembly 200, 300, and/or 800 (see FIGS. 2, 3, and 8), which may include a singular LED semiconductor or an array of LED semiconductors. In one embodiment, LED assembly 610 may include a reflecting element, such as reflective coating 204 and/or substrate 101 (see FIG. 3) when bulk reflector 612 does not extend behind LED assembly 610 to form a concave structure, but may remain open and/or hollow, at least to some extent. In another embodiment, LED assembly 610 may lack reflective elements, while bulk reflector 612 extends behind (e.g., over or around) LED assembly 610 to form a concave and/or parabolic reflective element (also obscured from view, see FIG. 5) that reflects light emerging from a back side of LED assembly 610. In various embodiments, LED lighting module 600 may include additional mounting elements, contact elements, and control circuitry (not shown).

Figure 7:
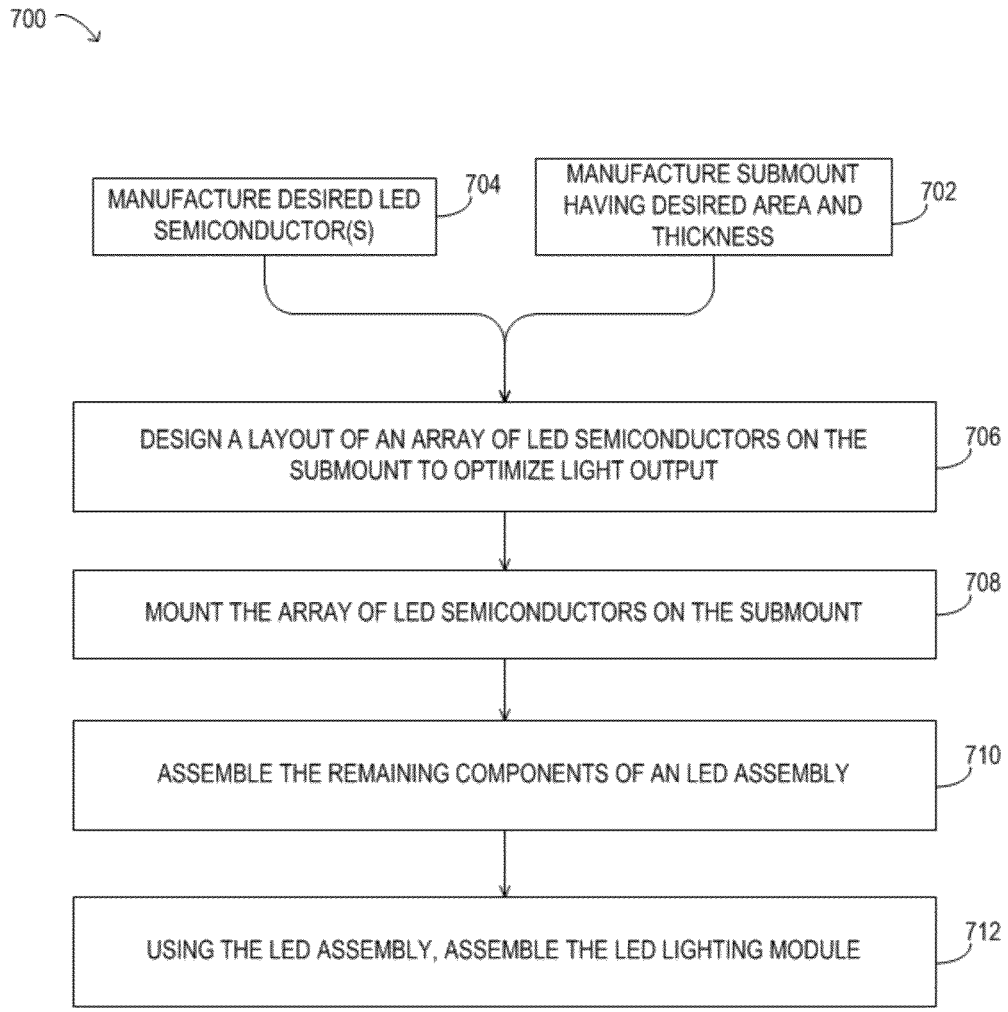
FIG. 7 depicts selected elements of an embodiment of a method for assembling an LED assembly.

Turning now to FIG. 7, selected operations of an embodiment of method 700 for assembling an LED assembly are illustrated. It is noted that certain operations described in method 700 may be optional and that the sequence of operations may be rearranged.

Method 700 may begin by manufacturing (operation 704) desired LED semiconductors. Parallel to operation 704, a submount having a desired area and thickness may be manufactured (operation 702). The submount in operation 702 may include a phosphor. In certain embodiments, manufacturing in operations 702 and/or 704 may be replaced with procurement operations. A layout of an array of LED semiconductors on a submount may be designed (operation 706) to optimize desired light output. Design operations in operation 706 may include specification of reflecting layers, bulk reflectors, and/ or phosphors. In one embodiment, total light output of the LED assembly may be maximized, optimized, or otherwise controlled by maintaining a specified exposed area of a first surface of the submount. The specified exposed surface area may be adjacent to interior edges (with respect to the submount) of each LED semiconductor in the LED assembly to minimize cross-reflection of light between LED semiconductors (see FIG. 4A). In certain embodiments, the exposed surface area may have a width about equal to a width of an LED semiconductor. The array of LED semiconductors may be mounted (operation 708) on the submount. Operation 708 may include the use of a low loss adhesive. The remaining components of an LED assembly may be assembled (operation 710). The LED assembly may be encapsulated using a transparent polymer, such as epoxy and/or silicone. Using the LED assembly, the LED lighting module may be assembled (operation 712).

Figure 8:
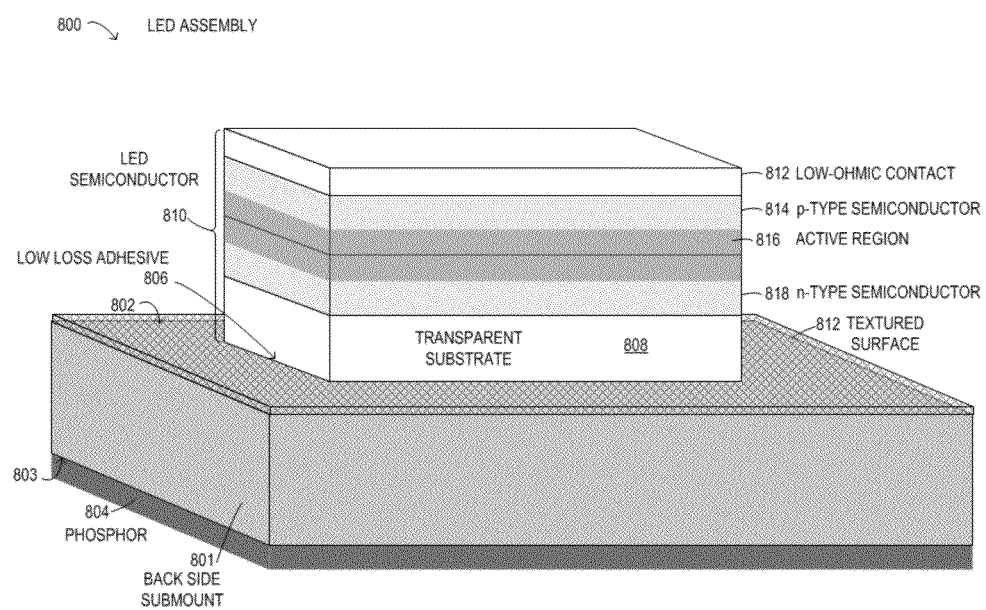
FIG. 8 depicts selected elements of an embodiment of an LED assembly.

Turning now to FIG. 8, a block diagram of selected elements of an embodiment of LED assembly 800 is illustrated. As shown in FIG. 8, LED assembly 800 includes LED semiconductor 810, back side submount 801, and phosphor 804. LED semiconductor 810 includes transparent substrate 808, n-type semiconductor 818, active region 816, p-type semiconductor 814, and low-ohmic contact 812. Transparent substrate 808 may represent a non-conductive optically transparent material that is used as a substrate to deposit (i.e., epitaxially grow) n-type semiconductor 818, upon which other semiconductor layers may be successively deposited.

In FIG. 8, back side submount 801 may be attached to LED semiconductor 810 at first surface 802 of back side submount 801 using low loss adhesive 806, which may be similar to low loss adhesive 206 (see FIG. 2). As shown, first surface 802 includes textured surface 812, which may represent a textured portion of back side submount 801. In some embodiments, second surface 803 may include a textured portion instead of first surface 802. Also shown is phosphor 804 forming second surface 803, which is opposite to first surface 802. In certain embodiments (not shown in FIG. 8), a phosphor may be used at first surface 802 instead of at second surface 803. In other embodiments (not shown), both a textured portion and a phosphor may be used at either first surface 802 or second surface 803. It is noted that back side submount 801, as shown, does not include a reflective coating at second surface 803, and may render LED assembly 800 suitable for use with certain bulk reflecting elements (see FIGS. 5 and 6). When back side submount 801 is used with a reflective coating (not shown, see FIG. 2) at second surface 803, LED assembly 800 may be mounted to a supporting substrate and/or a reflective layer.

It is noted that LED semiconductor 810 depicts an, alternative embodiment to LED semiconductor 210 (see FIG. 2) that operates similarly. Also, back side submounts 201, 301, 501 (see FIGS. 2, 3, and 5), as well as back side submount 801, may be interchanged with various types of LED semiconductors and are shown in exemplary embodiments for descriptive purposes.

To the maximum extent allowed by law, the scope of the present disclosure is to be determined by the broadest permissible interpretation of the following claims and their equivalents, and shall not be restricted or limited to the specific embodiments described in the foregoing detailed description.

What is claimed is:

1. A method of assembling a light emitting diode (LED) assembly, the method comprising:
    preparing a first LED semiconductor comprising a p-type semiconductor, an n-type semiconductor and an active region between the p-type semiconductor and the n-type semiconductor;
    forming a transparent contact layer on one of the p-type semiconductor and the n-type semiconductor;
    preparing a submount including a first surface and a second surface opposite the first surface, the submount comprising an optically transparent material;
    forming a phosphor layer on the first surface of the submount;
    forming a reflective coating layer on the second surface of the submount;
    mounting the first LED semiconductor to the first surface of the submount with the transparent contact layer and the phosphor layer therebetween, thereby providing light generated at the active region with an optical path to the submount at the first surface of the submount, wherein the reflective coating layer reflecting the light following the optical path and passing through the submount.

2. The method of claim 1, wherein mounting the LED semiconductor includes applying an adhesive between the first LED semiconductor and the first surface of the submount.

3. The method of claim 1, further comprising:
    mounting the submount to a substrate.

4. The method of claim 1, further comprising:
    attaching a second LED semiconductor to the first surface of the submount, wherein a spacing between the first LED semiconductor and the second LED semiconductor is selected to maximize an exposed area of the submount adjacent to an interior edge of the first LED semiconductor and an interior edge of the second LED semiconductor with respect to the submount.

5. The method of claim 1, further comprising:
selecting a maximum thickness of the submount that complies with a thermal resistance parameter.

6. The method of claim 1, wherein the optically transparent material is selected from: sapphire, diamond, silica, and glass.

7. The method of claim 1, wherein the transparent contact layer is an ohmic contact layer.

8. A light emitting diode (LED) assembly, comprising:
a first LED semiconductor including a p-type semiconductor, an n-type semiconductor and an active region between the p-type semiconductor and the n-type semiconductor;
a contact layer in contact with one of the p-type semiconductor and the n-type semiconductor, wherein the contact layer comprises a transparent low-ohmic material;
a submount including a first surface and a second surface opposite the first surface, the first LED semiconductor attached to the first surface with the contact layer therebetween, the submount including an optically transparent material, wherein light generated at the active region follows an optical path to the submount at the first surface;
a phosphor layer formed between the submount and the contact layer; and
a reflective coating layer formed at the second surface of the submount, the reflective coating layer reflecting the light following the optical path and passing through the submount.

9. The LED assembly of claim 8, wherein at least one of the first surface of the submount and the second surface of the submount is a smooth surface of the optically transparent material.

10. The LED assembly of claim 8, further comprising:
a second LED semiconductor attached to the first surface of the submount, wherein a position of the first LED semiconductor with respect to the second LED semiconductor is selected to maximize an exposed area of the submount adjacent to an interior edge of the first LED semiconductor and an interior edge of the second LED semiconductor with respect to the submount.

11. The LED assembly of claim 8, wherein a plurality of LED semiconductors, including the first LED semiconductor, are disposed on the first surface of the submount to maximize an exposed surface area of the first surface of the submount adjacent to interior edges of each of the plurality of LED semiconductors with respect to the submount.

12. The LED assembly of claim 8, further comprising:
a substrate to which the second surface of the submount is mounted.

13. The LED assembly of claim 8, wherein at least one of the first surface and the second surface of the submount is a textured surface.

14. The LED assembly of claim 8, wherein the first surface of the submount includes a textured surface covered by the phosphor layer.

15. The LED assembly of claim 8, further comprising:
a bulk reflective element extending over the second surface of the submount.

16. The LED assembly of claim 8, wherein the optically transparent material is selected from: sapphire, diamond, silica, and glass.

17. The LED assembly of claim 8, wherein a thickness of the submount is selected to comply with a thermal resistance parameter.

18. A light emitting diode (LED) assembly, comprising:
an LED semiconductor including a p-type semiconductor, an n-type semiconductor and an active region between the p-type semiconductor and the n-type semiconductor;
a contact layer in contact with one of the p-type semiconductor and the n-type semiconductor, wherein the contact layer comprises a transparent material;
a submount including a first surface and a second surface opposite the first surface, the LED semiconductor attached to the first surface with the contact layer therebetween, the submount including an optically transparent material;
a phosphor layer formed between the submount and the contact layer; and
a reflective coating layer formed at the second surface of the submount.

19. The LED assembly of claim 18, wherein at least one of the first surface of the submount and the second surface of the submount is a smooth surface of the optically transparent material.

20. The LED assembly of claim 18, further comprising:
a substrate to which the second surface of the submount is mounted.

21. The LED assembly of claim 18, wherein at least one of the first surface and the second surface of the submount is a textured surface.

22. The LED assembly of claim 18, wherein the first surface of the submount includes a textured surface covered by the phosphor layer.

23. The LED assembly of claim 18, further comprising:
a bulk reflective element extending over the second surface of the submount.

24. The LED assembly of claim 18, wherein the optically transparent material is selected from: sapphire, diamond, silica, and glass.

* * * * *